United States Patent
Wang (10) Patent No.: US 7,498,881 B2
(45) Date of Patent: Mar. 3, 2009

(54) SWITCHING AUDIO POWER AMPLIFIER AND METHOD FOR POP NOISE SUPPRESSION

(75) Inventor: Tze-Chien Wang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 74 days.

(21) Appl. No.: 11/819,140

(22) Filed: Jun. 25, 2007

(65) Prior Publication Data

US 2008/0024216 A1    Jan. 31, 2008

(30) Foreign Application Priority Data

Jun. 29, 2006    (TW) ............... 95123461 A (51) Int. Cl.
*H03F 3/217* (2006.01)
(52) U.S. Cl. ............... 330/251; 330/10; 330/207 A
(58) Field of Classification Search .......... 330/10, 330/207 A, 251; 375/238; 381/94.5
See application file for complete search history.

(56) References Cited

U.S. PATENT DOCUMENTS

| | | | |
|---|---|---|---|
| 4,788,508 A | 11/1988 | Kawai et al. | |
| 5,682,121 A | 10/1997 | Naokawa et al. | |
| 6,157,726 A | 12/2000 | Carroll et al. | |
| 6,516,067 B1 | 2/2003 | Lee et al. | |
| 2006/0262843 A1* | 11/2006 | Kim et al. | 375/238 |
| 2008/0089532 A1* | 4/2008 | Lee et al. | 381/94.5 |

* cited by examiner

*Primary Examiner*—Robert Pascal
*Assistant Examiner*—Hieu P Nguyen
(74) *Attorney, Agent, or Firm*—Muncy, Geissler, Olds & Lowe PLLC (57) ABSTRACT

A switching audio power amplifier and a method for pop noise suppression. The switching audio power amplifier includes a pulse width modulation (PWM) signal generator for generating a PWM signal; a counter for generating counting values $k_1 \sim k_N$ in N time intervals according to the PWM signal; N switch transistors connected in parallel and controlled by the counting values $k_1 \sim k_N$ to turn on and off; and an impedance switching unit, which has a gate for receiving a switching audio signal and one terminal coupled to the switch transistors, and outputs a signal from the terminal. Because the N switch transistors are turned on or off one by one at different timings, the switching audio power amplifier of the invention can effectively suppress the pop noise.

25 Claims, 8 Drawing Sheets

SWITCHING AUDIO POWER AMPLIFIER AND METHOD FOR POP NOISE SUPPRESSION

This application claims the benefit of the filing date of Taiwan Application Ser. No. 095123461, filed on Jun. 29, 2006, the content of which is incorporated herein by reference.

BACKGROUND OF THE INVENTION

1. Field of Invention

The invention relates in general to a switching audio power amplifier and a method for pop noise suppression, and more particularly to a switching audio power amplifier for suppressing pop noise by gradually turning on or off a plurality of control switches.

2. Related Art

Figures 1A, 1B:
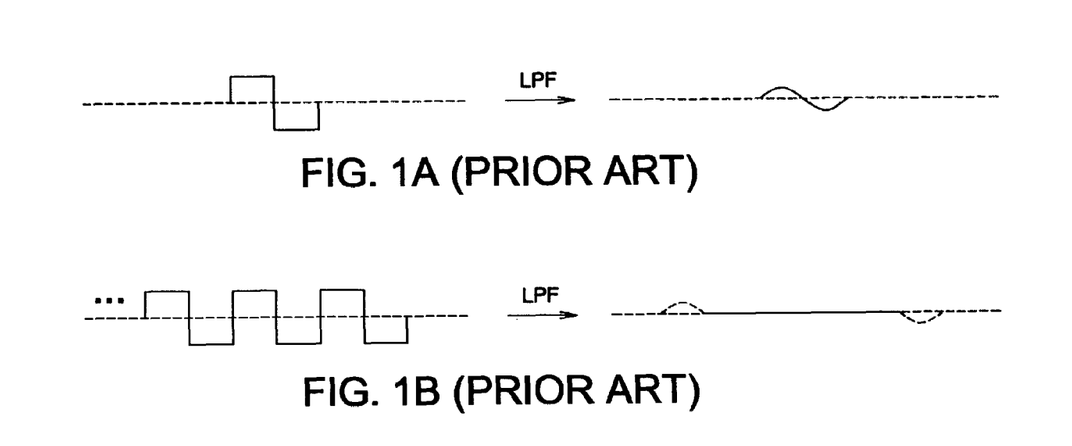
FIGS. 1A to 1D show waveforms generated after a pulse or pulses pass through a low-pass filter when the pulse or pulses suddenly appear or disappear.
Figures 1C, 1D:
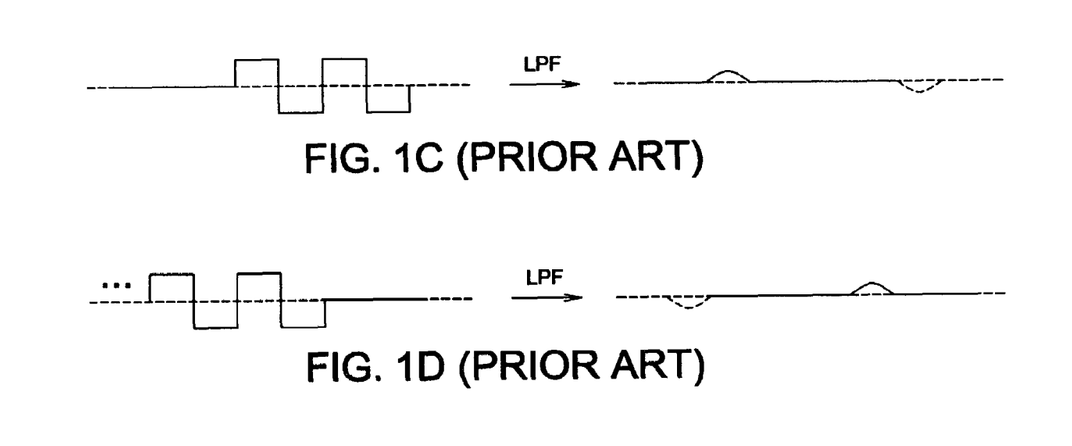

When an audio power amplifier is powered on or off, an uncomfortable pop noise may be induced if the switching is not smooth enough during the period when an audio signal suddenly appears or disappears. FIGS. 1A to 1D show waveforms generated after a pulse or pulses pass through a low-pass filter when the pulse or pulses suddenly appear or disappear. As shown in FIG. 1A, when there is only one pulse in an input signal, two inrushes (up and down inrushes) may appear after the input signal passes through the low-pass filter. As shown in FIG. 1B, when there are a series of pulses, no inrush is generated when the input signal passes through the low-pass filter. However, there must be a start (power on) and an end (power off) in the series of pulses in FIG. 1B, and the corresponding start and end signals are shown in FIGS. 1C and 1D. So, as shown in FIGS. 1C and 1D, the inrushes will still appear after the input signal passes through the low-pass filter. If the inrushes reach the levels that may be heard by human ears, an annoying pop noise is generated.

Typical audio power amplifiers are classified into analog power amplifiers with changeable amplitude of the output signal, and switching audio power amplifiers with fixed amplitude of the output signal. The methods of pop noise suppression in the analog power amplifier have been disclosed in, for example, U.S. Pat. Nos. 4,788,508, 5,682,121; 6,157,726 and 6,516,067. However, these patents provide the circuits working in conjunction with analog power outputs, and are thus not suitable for switching audio power amplifiers that are originally discontinuous in nature.

SUMMARY OF THE INVENTION

It is therefore an object of the invention to provide a switching audio power amplifier for suppressing pop noise using a circuit having transistor switches which are turned on or off individually.

The invention achieves the above-identified object by providing a switching audio power amplifier including a pulse width modulation (PWM) signal generator, a counter, N switch transistors and an impedance switching unit. The PWM signal generator generates a PWM signal. The counter generates a plurality of counting values $k_1 \sim k_N$ according to the PWM signal in N time intervals. The N switch transistors are connected in parallel and controlled by the counting values $k_1 \sim k_N$ to be turned on or off. The impedance switching unit has a gate for receiving a switching audio signal and one terminal coupled to the switch transistors, and outputs a signal from the terminal.

Because the N switch transistors are turned on or off individually, the switching audio power amplifier of the invention can effectively suppress the pop noise.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The switching audio power amplifier and the method of pop noise suppression according to the invention will be described with reference to the accompanying drawings.

Figure 3:
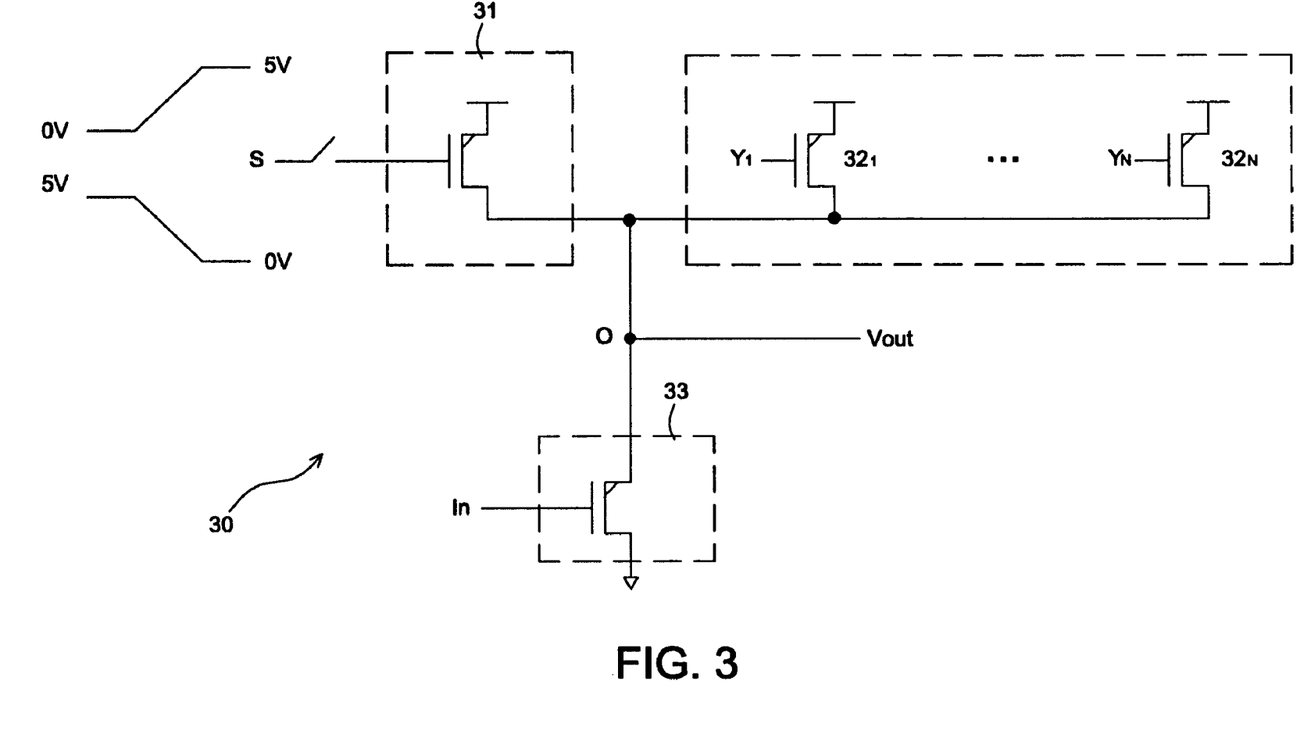
FIG. 3 is a circuit diagram showing a switching audio power amplifier according to the invention.

FIG. 3 is an embodiment of a switching audio power amplifier 30 illustrated according to the present invention. Referring to FIG. 3, the switching audio power amplifier 30 of the embodiment includes an adjusting transistor 31, a plurality of switch transistors $32_1 \sim 32_N$, and an impedance switching unit 33.

The adjusting transistor 31 is connected in parallel to the switch transistors $32_1 \sim 32_N$, and then connected to the impedance switching unit 33 in series. The adjusting transistor 31 receives a control signal S through its gate to change an impedance value gradually. The switch transistors $32_1 \sim 32_N$ are connected in a parallel manner and are controlled by a set of switch signals $Y_1 \sim Y_N$ to turn on or off individually. The impedance switching unit 33 receives a switching audio signal through its gate with one terminal coupled to the adjusting transistor 31 and the switch transistors $32_1 \sim 32_N$. The terminal O is defined as an output terminal for outputting a signal.

Figure 2A:
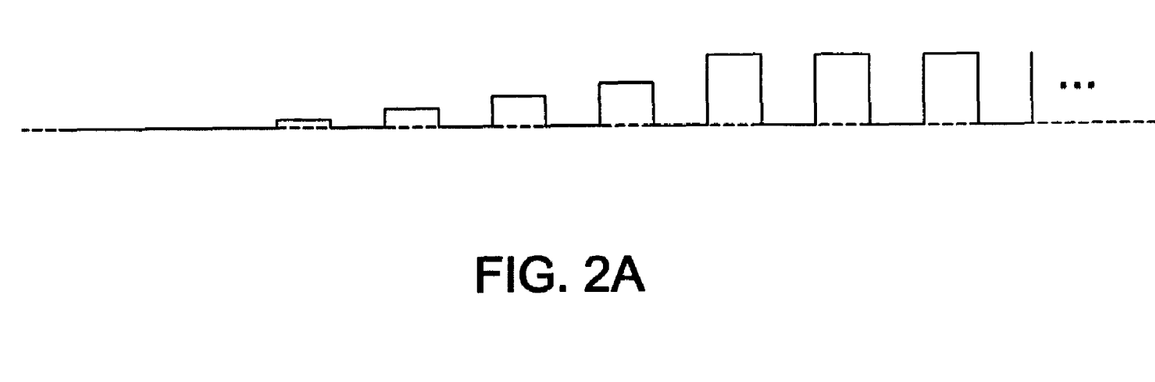
FIG. 2A shows a waveform, in which pulse amplitudes are gradually increased from 0.
Figure 2B:
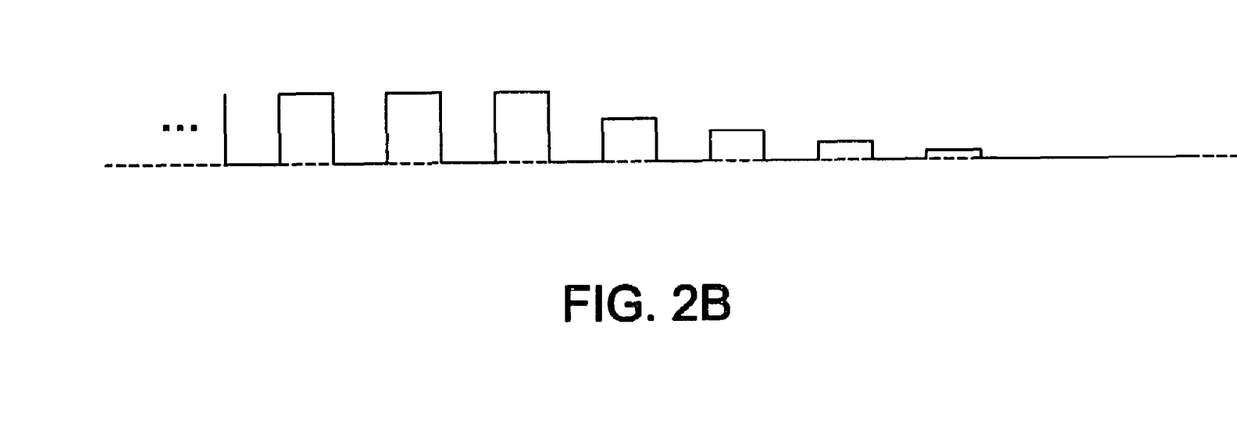
FIG. 2B shows a waveform, in which pulse amplitudes are gradually decreased to 0.

According to the present invention, if the pulse amplitude of the output signal is gradually increased when the power is on (see the waveform having the pulse amplitude gradually increased from 0 in FIG. 2A) and the pulse amplitude of the output signal is gradually decreased when the power is off (see the waveform having the pulse amplitude gradually decreased to 0 in FIG. 2B), the inrush becomes so small that it is no longer perceptible by human ears, the pop noise is thereby suppressed.

Thus, when the switching audio power amplifier starts to enable, the adjusting transistor 31 receives the control signal S and then gradually changes the impedance value, where the control signal S is changed from a low level (e.g. 0V) to a high level (e.g. 5V) repeatedly. When the control signal S reaches the high level, one of the switch transistors is turned on according to the switch signal while the control signal S returns to the low level. At this time, the impedance values of the adjusting transistor 31 and the switch transistors $32_1 \sim 32_N$ are far greater than the impedance value of the impedance switching unit 33. Therefore, the amplitude of the output voltage Vout will be considerably small, and the pop noise will not be perceptible by human ears. When the switching audio power amplifier is about to disable, the adjusting transistor 31 receives the control signal S and then gradually changes the impedance value. The control signal S is changed from the high level to the low level, and when the control signal S reaches the low level, one of the switch transistors is turned off according to the switch signal while the control signal S returns to the high level.

Figure 4A:
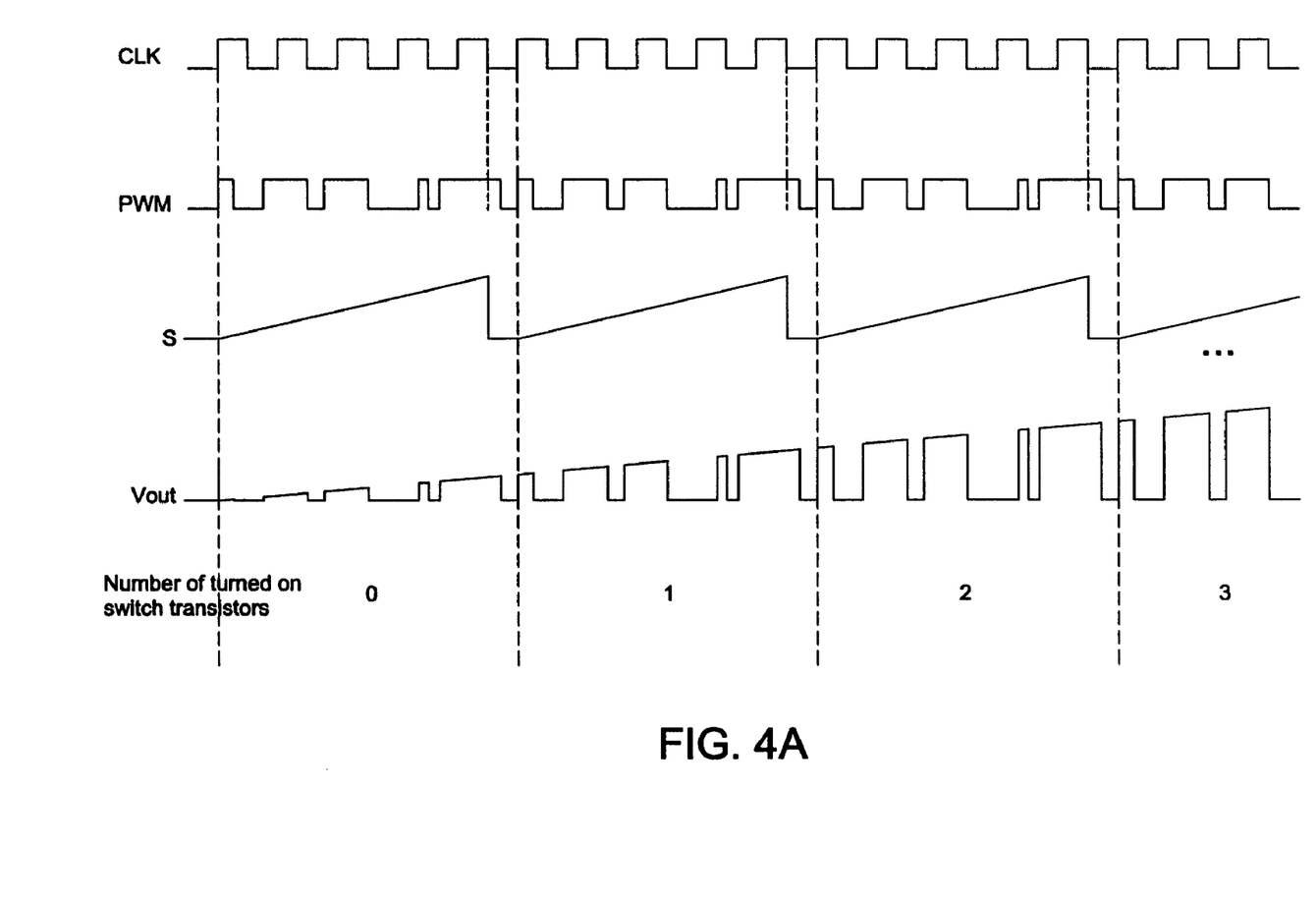
FIG. 4A is a schematic illustration showing an output voltage Vout, a control signal S and the number of switch transistors turned on when the power is on in the switching audio power amplifier of the invention.

FIG. 4A is a schematic illustration showing the output voltage Vout, the control signal S, the clock signal CLK, the PWM signal PWM and the number of switch transistors turned on when the power is on in the switching audio power amplifier of the present invention. As shown in FIG. 4A, the switching audio power amplifier 30 of the invention gradually increases the output voltage Vout by changing the impedance value of the adjusting transistor 31 and by turning on the switch transistors $32_1 \sim 32_N$ individually. Thus, the output voltage Vout exhibits a gradually rising waveform as illustrated in FIG. 2A, such that the pop noise generated by the inrushes when power is on can be effectively reduced.

Figure 4B:
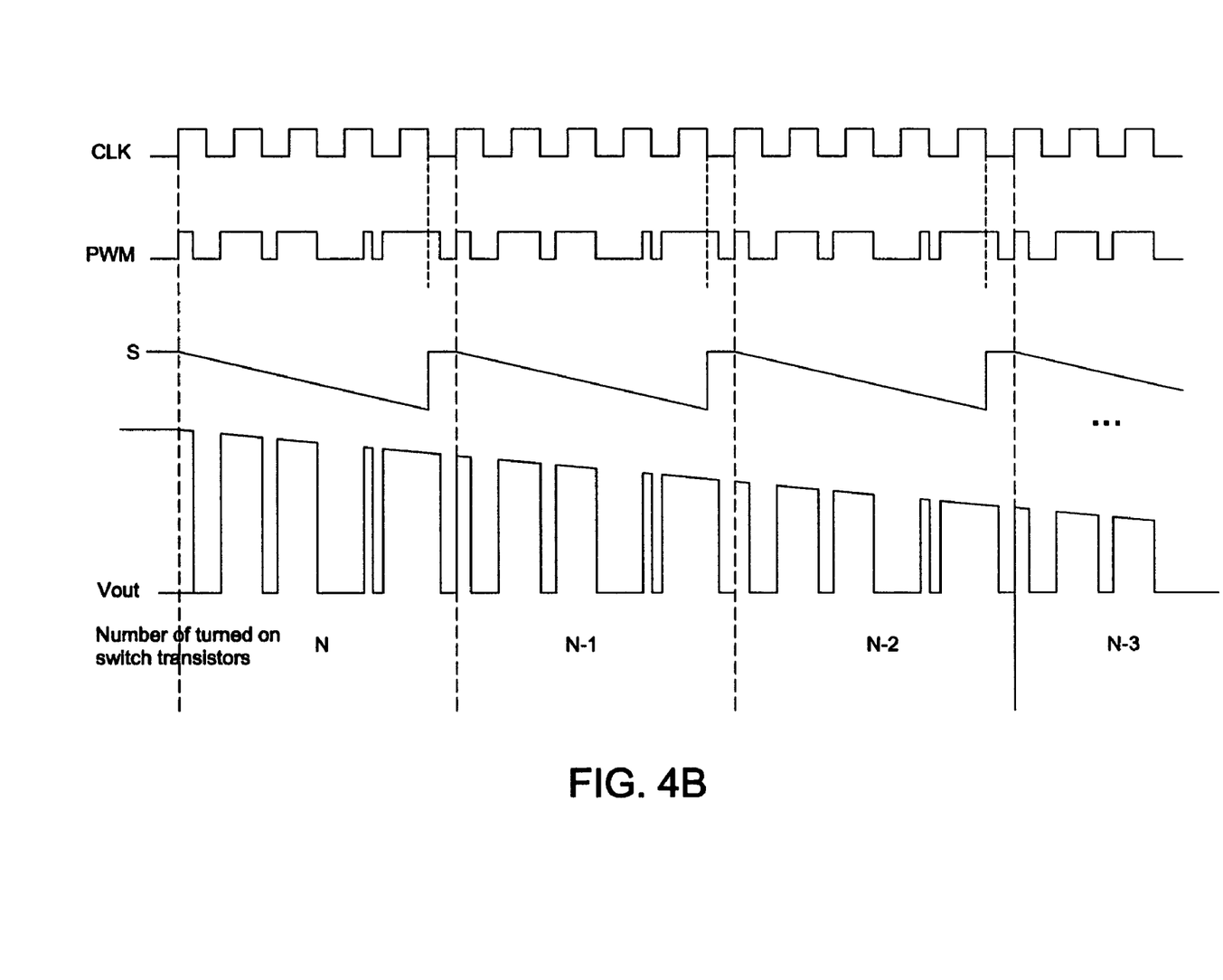
FIG. 4B is a schematic illustration showing the output voltage Vout, the control signal S and the number of switch transistors turned on when the power is off in the switching audio power amplifier of the invention.

FIG. 4B is a schematic illustration showing the output voltage Vout, the control signal S, the clock signal CLK, the PWM signal PWM and the number of switch transistors turned on when the power is off in the switching audio power amplifier of the present invention. As shown in FIG. 4B, the switching audio power amplifier 30 of the invention gradually decreases the output voltage Vout by changing the impedance value of the adjusting transistor 31 and by turning off the switch transistors $32_1 \sim 32_N$ individually. Thus, the output voltage Vout exhibits a gradually falling waveform as illustrated in FIG. 2B, such that the pop noise generated by the inrushes when power is off can be effectively reduced.

Figure 5:
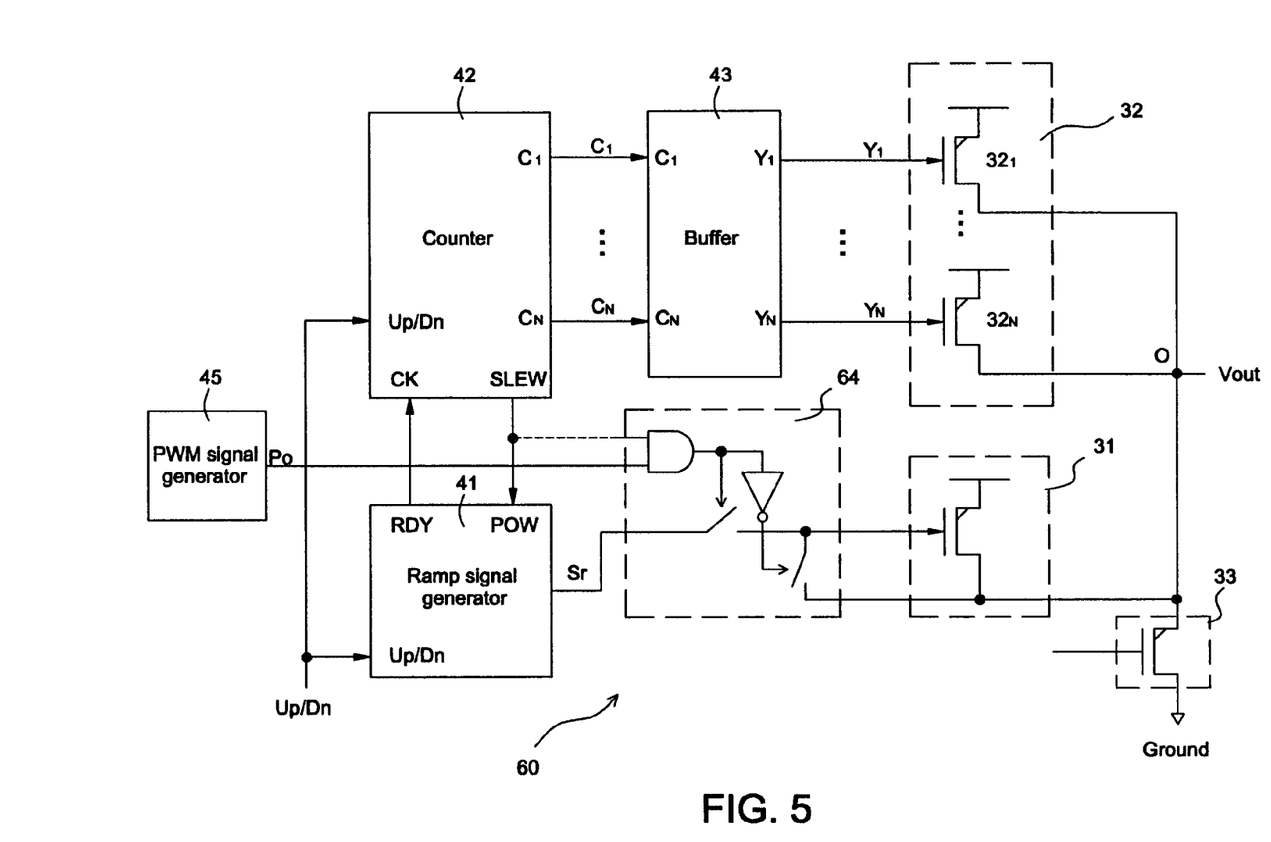
FIG. 5 is a block diagram showing a switching audio power amplifier according to a first embodiment of the invention.

FIG. 5 is a switching audio power amplifier 60 illustrated according to a first embodiment of the invention. Referring to FIG. 5, the switching audio power amplifier 60 of the embodiment includes an adjusting transistor 31, a switch transistor unit 32, an impedance switching unit 33, a ramp signal generator 41, a counter 42, a buffer 43, a PWM signal generator 45 and a switch unit 64.

The ramp signal generator 41 generates a control signal S and changes the slope of the control signal S to be positive or negative according to a mode signal UP/DN. When the control signal S reaches a first threshold value (the lowest voltage of the control signal S in this embodiment) or a second threshold value (the highest voltage of the control signal S in this embodiment), a periodic impulse RDY is generated. The counter 42 calculates the number of the periodic impulses RDY, which serves as the count signals, and generates a count value C as the switch signals $Y_1 \sim Y_N$. The counter 42 up-counts or down-counts under the control of the mode signal UP/DN. In addition, the counter 42 generates a slew signal SLEW so that the ramp signal generator 41 stops operating when the count value equals to 0 or any other default value (e.g. the number N of the switch transistors).

As shown in the embodiment of FIG. 5, the switch unit 64 receives the slew signal SLEW and the PWM signal, and enables or disables the impedance switching unit 33 from operating when the count value C is N or 0, respectively.

The buffer 43 is set between the counter 42 and the switch transistor unit 32 to drive the switch transistors $32_1 \sim 32_N$. Of course, if the driving ability of the counter 42 is sufficient to drive the switch transistors $32_1 \sim 32_N$, the buffer 43 may be omitted. The mode signal UP/DN in the first mode represents that the power is on. At this time, the control signal S has the positive slope and the counter 42 up-counts, the switch transistors $32_1 \sim 32_N$ are therefore turned on individually. The mode signal UP/DN in the second mode, which is quite the reverse, represents that the power is off. At this time, the control signal S has the negative slope and the counter 42 down-counts, the switch transistors $32_1 \sim 32_N$ are therefore turned off individually. The operation of the switching audio power amplifier 60 in the present invention will be shown in detail as follows, while assuming that there are five switch transistors (i.e., N=5) in this embodiment.

The following description relates to the case when the mode signal UP/DN is in the first mode. When the switching audio power amplifier 60 is powered on, the ramp signal generator 41 repeatedly generates the control signal S with the positive slope, and generates a periodic impulse RDY when the control signal S reaches the second threshold value (e.g., 5V). The gate of the adjusting transistor 31 receives the control signal S to gradually decrease the impedance value. Meanwhile, the counter 42 counts the number of periodic impulses RDY and up-counts to generate the count values C1, C2, C3, C4 and C5, which act as the switch signals Y1, Y2, Y3, Y4 and Y5 to drive the switch transistors 321, 322, 323, 324 and 325, respectively. When the count value is equal to 5, the counter 42 enables the slew signal SLEW to hold the ramp signal generator 41 in its final state. Thus, when the power is on, the pop noise generated by the inrushes are effectively reduced by turning on the switch transistors 321, 322, 323, 324 and 325 individually, and gradually increasing the pulse amplitude of the output signal Vout.

The following description relates to the case when the mode signal UP/DN is in the second mode. When the switching audio power amplifier 60 is powered off, the ramp signal generator 41 repeatedly generates the control signal S with the negative slope, and generates a periodic impulse RDY when the control signal S reaches the first threshold value (e.g., 0V). The gate of the adjusting transistor 31 receives the control signal S to gradually increase the impedance value. Meanwhile, the counter 42 counts the number of periodic impulses RDY and down-counts to generate the count values C1, C2, C3, C4 and C5, which act as the switch signals Y1, Y2, Y3, Y4 and Y5 for driving the switch transistors 321, 322, 323, 324 and 325, respectively. When the count value is equal to 0, the counter 42 enables the slew signal SLEW to hold the ramp signal generator 41 in its final state. Thus, when the power is off, the pop noise generated by the inrushes are effectively reduced by turning off the switch transistors 321, 322, 323, 324 and 325 individually, and gradually decreasing the pulse amplitude of the output signal Vout.

Figure 6:
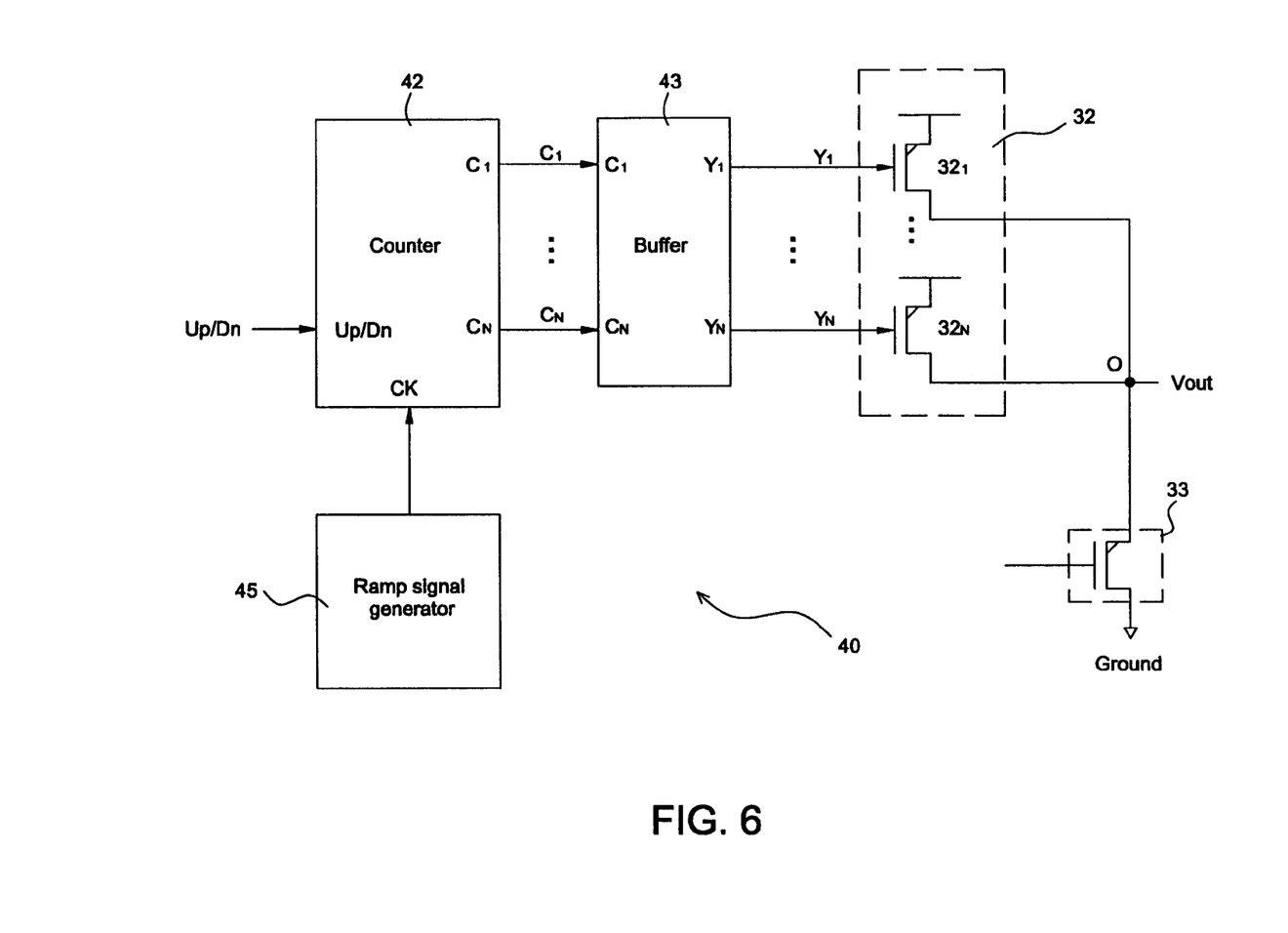
FIG. 6 is a block diagram showing a switching audio power amplifier according to a second embodiment of the invention.

FIG. 6 is a switching audio power amplifier 40 illustrated according to a second embodiment of the invention. Referring to FIG. 6, the switching audio power amplifier 40 of the embodiment includes a switch transistor unit 32, an impedance switching unit 33, a counter 42, a buffer 43 and a PWM signal generator 45. The switching audio power amplifier generates a count value C to work as the switch signals $Y_1 \sim Y_N$ according to a PWM signal provided by the PWM signal generator 45. The count value C is determined by the counting values $k_1 \sim k_N$, wherein $k_1 \sim k_N$ may be the numbers of pulses of the PWM signal in the 1st~$N^{th}$ time intervals, or the numbers of pulses of reference clock signals in the 1st~$N^{th}$ time intervals. Other operation principles of this embodiment are similar to those of the first embodiment, and detailed descriptions thereof are therefore omitted.

Figure 7A:
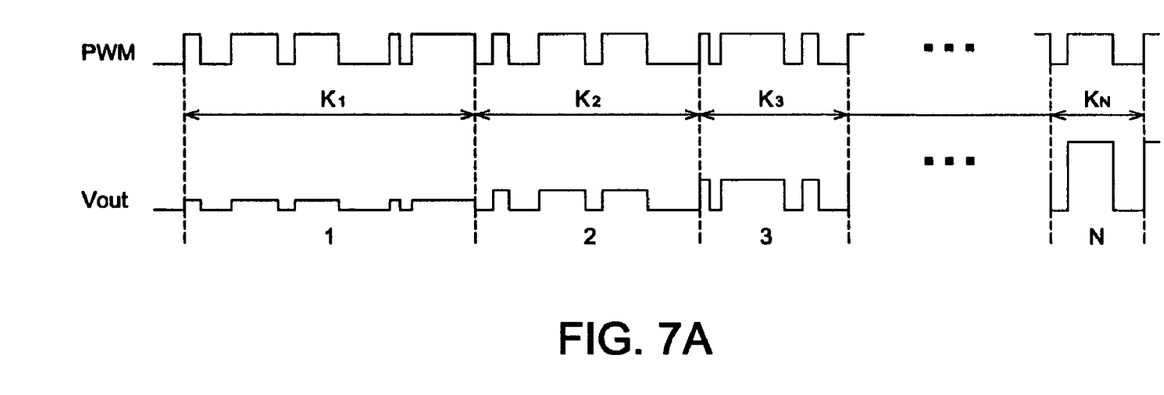
FIG. 7A is a schematic illustration showing a PWM signal and the output voltage Vout when the system of the second embodiment is enabled.
Figure 7B:
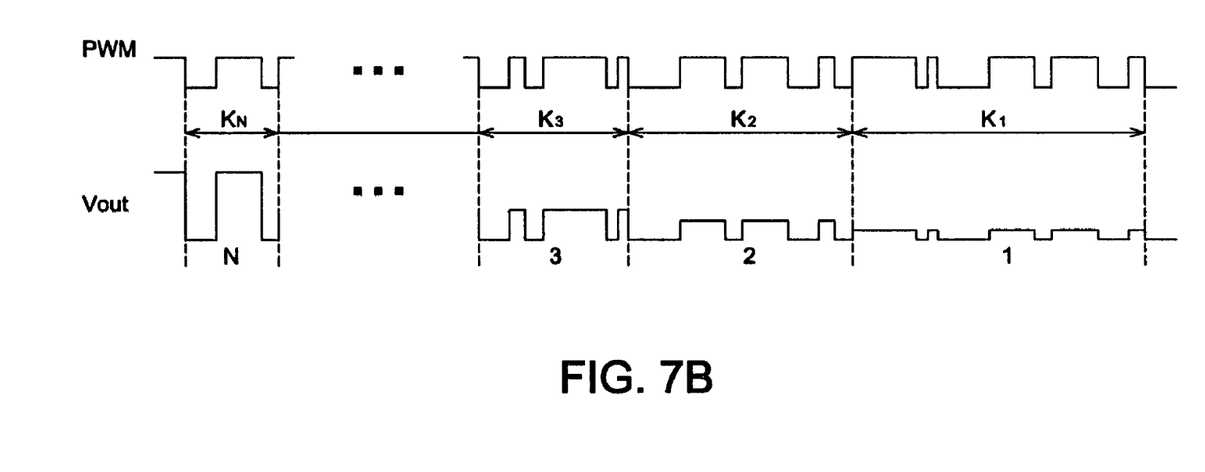
FIG. 7B is a schematic illustration showing the PWM signal and the output voltage Vout when the system of the second embodiment is disabled.

The working principles of the second embodiment will be described with reference to FIGS. 7A to 7B. As shown in FIG. 7A, the counting values $k_1 \sim k_N$ in N time intervals may be obtained from the PWM signal provided by the PWM signal generator 45, and the switch transistors $32_1 \sim 32_N$ are turned on individually according to whether the obtained counting values $k_1 \sim k_N$ respectively reach the default values preset in the corresponding time intervals. When one switch transistor is additionally turned on, the output voltage Vout is increased by a level. Thus, the output voltage Vout tends to rise gradually so that the pop noise generated by the inrushes when the power is on may be effectively reduced. As shown in FIG. 7B which is similar to FIG. 7A, the switch transistors $32_1 \sim 32_N$ are turned off individually according to whether the obtained counting values $k_1 \sim k_N$ respectively reach the default values. When one switch transistor is additionally turned off, the output voltage Vout is decreased by a level. Thus, the output voltage Vout tends to fall gradually so that the pop noise generated by the inrushes when the power is off may be effectively reduced. The principles of gradually increasing or decreasing the output voltage Vout have been described in the above-mentioned embodiment, so detailed descriptions thereof will be omitted herein.

In the above-mentioned embodiment, if the default values to be reached in the N time intervals are $K_1 \sim K_N$, it is possible to select the condition satisfying $K_1 > K_2 > K_3 \ldots > K_N$ to keep the procedures of powering on and off smooth. That is, the counting values $k_1 \sim k_N$ may need greater numbers of pulses to reach the default values $K_1 \sim K_N$ at the beginnings of power-on, while the counting values $k_1 \sim k_N$ may need greater numbers of pulses to reach the default values $K_1 \sim K_N$ at the endings of power-off. However, the scope of the invention is not limited thereto, i.e. the device will also operate normally when such conditions are not satisfied.

The method of suppressing the pop noise in the switching audio power amplifier of the invention will be described as follows. The switching audio power amplifier of the invention has an adjusting transistor, a plurality of switch transistors and an impedance switching unit. The adjusting transistor is connected in parallel with the switch transistors and then connected to the impedance switching unit in series. The serially connected node between the adjusting transistor and the impedance switching unit is defined as an output terminal for generating an output signal. The method of suppressing the pop noise of the switching audio power amplifier includes the following steps.

First, a ramp signal is generated, the slope of the ramp signal is changed to be positive or negative according to a mode signal, and a periodic impulse is generated when the ramp signal reaches a first threshold value or a second threshold value.

Next, the impedance value of the adjusting transistor is changed gradually by controlling the adjusting transistor according to the ramp signal.

Then, a set of switch signals is generated by counting the periodic impulse to generate a count value as the switch signal. Also, up-counting or down-counting is performed according to the mode signal, and a slew signal is enabled when the count value is equal to a default value (e.g. any preset value including 0).

Finally, the switch transistors are controlled according to the switch signals.

The mode signal in the first mode may represent that the power is on. At this time, the ramp signal has a positive slope, and the counter up-counts and the switch transistors are turned on individually. The mode signal in the second mode may represent that the power is off. At this time, the ramp signal has a negative slope, the counter down-counts, and the switch transistors are turned off individually.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A switching audio power amplifier, comprising:
   a pulse width modulation (PWM) signal generator for generating a PWM signal;
   a counter for generating a plurality of counting values $k_1 \sim k_N$ in N time intervals according to the PWM signal;
   N switch transistors connected in parallel and controlled by the counting values $k_1 \sim k_N$; and
   an impedance switching unit having a gate for receiving a switching audio signal, and one terminal coupled to the switch transistors, the impedance switching unit outputting a signal from the terminal.

2. The amplifier according to claim 1, wherein $k_X$ is the number of pulses of the PWM signal in an $X^{th}$ time interval, X=1~N.

3. The amplifier according to claim 1, wherein $k_X$ is the number of pulses of a reference clock signal in an $X^{th}$ time interval, X=1~N.

4. The amplifier according to claim 1, wherein when the amplifier starts to enable, the counting value $k_X$ reaches a default value $K_X$ of an $X^{th}$ time interval, and turns on one of the switch transistors, X=1~N.

5. The amplifier according to claim 4, wherein when the amplifier starts to enable, the default value $K_X$ of an earlier time interval is greater, X=1~N.

6. The amplifier according to claim 1, wherein when the amplifier is about to disable, the counting value $k_X$ reaches a default value $K_X$ of an $X^{th}$ time interval, and turns off one of the switch transistors, X=1~N.

7. The amplifier according to claim 6, wherein when the amplifier is about to disable, the default value $K_X$ of a later time interval is greater, X=1~N.

8. A switching audio power amplifier, comprising:
   a plurality of switch transistors, which is connected in parallel and receives a set of switch signals, the switch signals controlling the switch transistors to be turned on or off individually;

an adjusting transistor connected in parallel to the switch transistors, the adjusting transistor having a gate for receiving a control signal to gradually change an impedance value; and an impedance switching unit having a gate for receiving a switching audio signal, and one terminal coupled to the adjusting transistor and the switch transistors, the impedance switching unit outputting a signal from the terminal.

9. The amplifier according to claim 8, wherein:

when the switching audio power amplifier starts to enable, the adjusting transistor receives the control signal and then gradually decreases the impedance value, and the control signal is changed from a first level to a second level; and when the control signal reaches the second level, one of the switch transistors is turned on according to the switch signals while the control signal returns to the first level.

10. The amplifier according to claim 8, wherein:

when the switching audio power amplifier is about to disable, the adjusting transistor receives the control signal and then gradually increases the impedance value, and the control signal is changed from a second level to a first level; and when the control signal reaches the first level, one of the switch transistors is turned off according to the switch signals while the control signal returns to the second level.

11. The amplifier according to claim 8, further comprising:

a ramp signal generator for generating the control signal and generating a periodic impulse when the control signal reaches a threshold value; and a counter for counting the periodic impulse, generating a count value to serve as one of the switch signals and enabling a slew signal when the count value is a default value.

12. The amplifier according to claim 11, wherein when the slew signal is enabled, the counter stops counting and holds an original count value.

13. The amplifier according to claim 11, further comprising a switch unit, which is set between the ramp signal generator and the adjusting transistor, the switch unit is controlled by the slew signal and is turned off when the slew signal is enabled.

14. The amplifier according to claim 11, wherein when the slew signal is enabled, the adjusting transistor holds the same state.

15. The amplifier according to claim 11, wherein the threshold value is a lowest voltage of the control signal.

16. The amplifier according to claim 11, wherein the threshold value is a highest voltage of the control signal.

17. The amplifier according to claim 11, wherein the default value is the number of the switch transistors.

18. The amplifier according to claim 11, wherein the default value is 0.

19. The amplifier according to claim 11, wherein up-counting or down-counting is enabled according to a mode signal.

20. The amplifier according to claim 11, wherein the slope of the control signal is changed positive or negative according to a mode signal.

21. The amplifier according to claim 11, wherein when power is on the control signal has a positive slope and the counter up-counts.

22. The amplifier according to claim 11, wherein when power is off the control signal has a negative slope and the counter down-counts.

23. A method of suppressing pop noise in a switching audio power amplifier, which comprises a plurality of switch transistors and an impedance switching unit, wherein the switch transistors are connected in parallel, and the impedance switching unit has a gate for receiving a switching audio signal and one terminal coupled to the switch transistors, and the impedance switching unit outputs a signal from the terminal, the method comprising the steps of:

turning on one of the switch transistors in each time interval when the amplifier starts to enable; and turning off one of the switch transistors in each time interval when the amplifier is about to disable, wherein the switch transistor is turned on and off according to a set of switch signals.

24. The method according to claim 23, wherein the set of switch signals is determined by a plurality of counting values generated according to a pulse width modulation (PWM) signal.

25. The method according to claim 23, wherein the set of switch signals is determined by a count value generated according to a periodic impulse.

* * * * *